United States Patent [19]

Watanabe et al.

[11] 4,196,171
[45] Apr. 1, 1980

[54] APPARATUS FOR MAKING A SINGLE CRYSTAL OF III-V COMPOUND SEMICONDUCTIVE MATERIAL

[75] Inventors: Masayuki Watanabe; Katsutoshi Komeya, both of Yokohama; Masahiro Nakajima, Yokosuka, all of Japan

[73] Assignee: Tokyo Shibaura Denki Kabushiki Kaisha, Kawasaki, Japan

[21] Appl. No.: 930,696

[22] Filed: Aug. 3, 1978

[30] Foreign Application Priority Data

Sep. 5, 1977 [JP] Japan .................. 52-105771

[51] Int. Cl.² .................. B01J 17/00; B01J 17/20
[52] U.S. Cl. .................. 422/246; 422/249; 156/607; 156/608; 156/617 SP; 156/DIG. 70
[58] Field of Search .................. 422/246, 248, 249; 156/607, 608, 617 SP, DIG. 70

[56] References Cited

U.S. PATENT DOCUMENTS

| | | | |
|---|---|---|---|
| 3,002,824 | 10/1961 | Francois | 156/608 |
| 3,647,389 | 3/1972 | Weiner | 156/607 |
| 3,969,125 | 7/1976 | Komeya et al. | 106/73.2 |
| 3,980,438 | 9/1976 | Castonguay et al. | 422/249 |

FOREIGN PATENT DOCUMENTS 51-64482  6/1976  Japan .
51-92789  8/1976  Japan .

OTHER PUBLICATIONS

Nygren, Ringel, and Verleur, "Properties of GaP Single Crystals Grown by Liquid Encapsulated Pulling", J. Electrochem. Soc.: Solid State Science, vol. 118, No. 2, Feb. 1971, pp. 306-312.

*Primary Examiner*—R.E. Serwin
*Assistant Examiner*—Chris Konkol
*Attorney, Agent, or Firm*—Oblon, Fisher, Spivak, McClelland & Maier

[57] ABSTRACT

An apparatus includes a sealed vessel, a crucible received in the sealed vessel to hold a first molten liquid of III-V compound semiconductive material and a second molten liquid of an encapsulating material overlying the first molten liquid, and floating member having an opening for defining the cross sectional outline of a single crystal while being grown and positioned in the interface between the first and second molten liquids. The floating member is made from a mixed material consisting essentially of at least one of oxides of yttrium and the lanthanum series elements, alumina and silicon nitride each in a prescribed amount.

6 Claims, 1 Drawing Figure

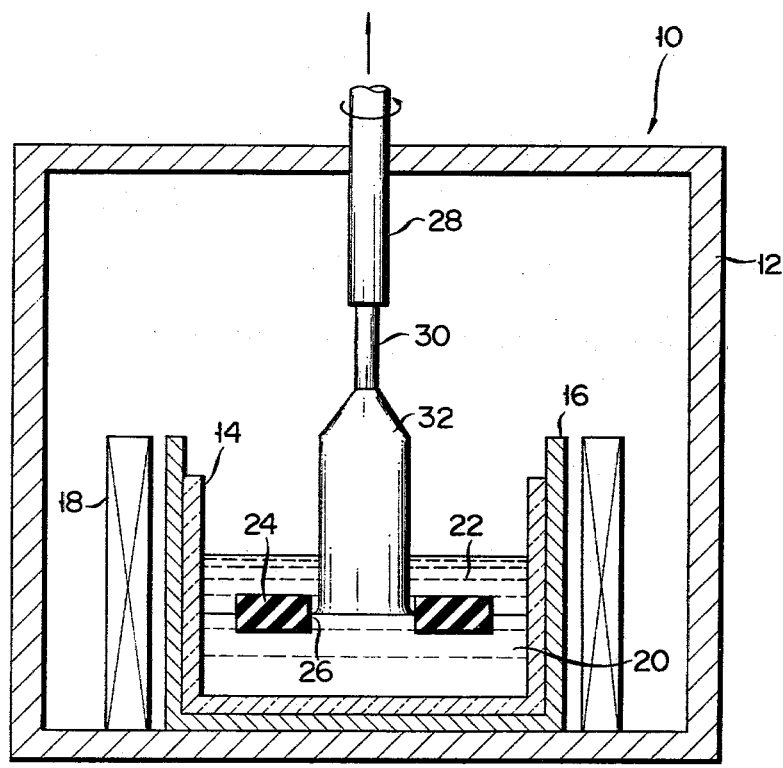

APPARATUS FOR MAKING A SINGLE CRYSTAL OF III-V COMPOUND SEMICONDUCTIVE MATERIAL

This invention relates to an apparatus for making a single crystal of III-V compound semiconductive material, and more particularly to an apparatus for producing such single crystal utilizing the liquid encapsulated Czochralski (abbreviated as "LEC") method.

A single crystal of III-V compound semiconductive materials such as gallium phosphide (GaP) and gallium arsenide (GaAs) is often used as a substrate of a light-emitting diode. A method most widely accepted at present for the growth of such single crystal is the LEC method which applies as an encapsulating layer a molten liquid of boron trioxide of low vapour pressure overlying a molten liquid of the III-V compound semiconductive material. The LEC method comprises the steps of holding the semiconductive material in a quartz crucible received in a pressure vessel, placing a mass of boron trioxide on the semiconductive material, and thermally melting the semiconductive material and boron trioxide mass by a heating device provided around the crucible so as to cause a molten liquid of boron trioxide (encapsulating layer) to overly a molten liquid of the semiconductive material, thereby suppressing the evaporation of the molten liquid of the semiconductive material. The interior of the pressure vessel is previously filled with an inert gas by vacuum substitution. Higher pressure is applied to the interior of the pressure vessel, according as the interior temperature rises by heating. When the semiconductive material gets molten, the interior pressure of the pressure vessel is kept at a higher level than the vapour pressure of said molten liquid, thereby suppressing the decomposition and evaporation of the semiconductive material. Under this condition, a seed crystal is brought into contact with a molten liquid of the semiconductive material through the encapsulating molten liquid of boron trioxide. A desired single crystal is grown normally by slowly pulling up the seed crystal through the encapsulating molten liquid of boron trioxide while rotating the seed crystal.

The above-mentioned LEC method indeed enables a high quality single crystal to be produced in quantities. But the LEC method still has the drawbacks that faults often arise in a single crystal obtained, and the cross sectional outline of the single crystal can not be exactly defined. The reason is assumed to be that since high pressure is involved, heat loss due to convection and the uneven temperature distribution near an interface between the molten liquid of the semiconductive material and the encapsulating molten liquid of boron trioxide become more prominent, thereby enlarging the interior distortion of a single crystal grown. Further, since the molten liquid of boron trioxide does not always act as a satisfactory encapsulating layer, as time goes on, the encapsulating molten liquid itself is contaminated by the semiconductive material and the molten liquid of the semiconductive material is evaporated through the encapsulating molten liquid of boron trioxide to cloud an observation window provided for the apparatus, thereby preventing the cross sectional outline of the single crystal from being exactly defined during its growth.

In Japanse Patent Application Disclosure No. 64482/76 (laid open to the public inspection on June 3, 1976) teaches to allow a floating member having an opening for defining the cross sectional outline of a single crystal during its growth to rest on the surface of a molten liquid of the semiconductive material, and to produce the single crystal by slowly pulling it up through the opening. Where the aforesaid encapsulating layer is applied, the floating member lies in an interface between the encapsulating layer and the molten liquid of the semiconductive material. The single crystal is grown in the form corresponding to the cross sectional outline of the opening of the floating member. The advantages accompanying the application of such floating member would be that since the floating member overlies part of the molten liquid of the semiconductive material, radiation of heat from the molten liquid is prevented, and thermal stability is ensured near an interface between a solid grown single crystal and a molten liquid of the raw material thereof, thereby providing a little-distorted single crystal semiconductor.

The above-mentioned Japanese Patent Application Disclosure cites, for example, boron nitride, silica, graphite, silicon nitride and silicon carbide as the raw material of the floating member. The floating member used for the above-mentioned object is demanded, as naturally expected, to have high corrosion resistance and mechanical strength and also be little liable to contaminate a molten liquid of the semiconductive material. A floating member prepared from even silicon nitride which is regarded as the most preferred among the above-listed materials sharply decreases in mechanical strength by erosion resulting from the action of highly corrosive boron trioxide. Consequently, the floating member itself contaminates a molten liquid of the semiconductive material. Moreover, a single crystal grown by being pulled up through the opening of the floating member which has been distorted by mechanical weakness gets too much out of shape for practical application. Further, after the full growth of a single crystal, the molten liquid of the semiconductive material and the molten liquid of boron trioxide remaining in the crucible are solidified with the floating member immersed therein. Therefore, the floating member is readily subject to breakage due to mechanical shocks resulting from said solidification and fails to be repeatedly applied.

It is accordingly an object of this invention to provide an apparatus which, even where repeatedly applied, can always prepare a high crystallinity single crystal of III-V compound semiconductive material which is little subject to distortion.

According to this invention, there is provided an apparatus for making a single crystal of III-V compound semiconductive material which comprises:

a sealed vessel;

a crucible received in the sealed vessel to hold a first molten liquid of a III-V compound semiconductive material from which a single crystal is to be grown and a second molten liquid of an encapsulating material overlying said first molten liquid; and a floating member which has a smaller density than said first molten liquid and a larger density than said second molten liquid and is set in an interface between said first and second molten liquids, said flowing member being made from a mixed material consisting essentially of 0.5 to 10% by weight of at least one metal oxide member selected from the group consisting of oxides of yttrium and lanthanum series elements, 0.5 to 10% by weight of aluminium oxide and the balance of silicon nitride, and having an opening for defining the cross sectional outline of the single crystal during its growth.

BRIEF DESCRIPTION OF DRAWING

The accompanying drawing is a schematic cross sectional view of an apparatus embodying this invention for making a single crystal of III-V compound semiconductive material.

As seen from the appended drawing, an apparatus 10 according to this invention includes a sealed pressure vessel 12 and a crucible 14 formed of inert material such as quartz and received in the sealed vessel 12. The crucible 14 is held in a receptacle 16, around which a heater 18 is disposed. As indicated in the drawing, the crucible 14 contains a molten liquid 20 of the semiconductive material and an encapsulating molten liquid 22 of, usually, boron trioxide overlying the molten liquid 20. The III-V compound semiconductive material includes a binary system such as gallium phosphide, indium phosphide and gallium arsenide and a ternary system such as gallium phosphide arsenide. A typical semiconductive material is gallium phosphide or gallium arsenide.

A floating member 24 provided with an opening 26 for defining the cross sectional outline of a single crystal during its growth is set in an interface between the molten liquids 20 and 24. According to this invention, the floating member 24 is made from a mixed material consisting essentially of 0.5 to 10% by weight of at least one metal oxide member selected from the group consisting of oxides of yttrium and lanthnum series elements (i.e., elements having the atomic numbers of 57 to 71), 0.5 to 10% by weight of aluminium oxide ($Al_2O_3$) and silicon nitride ($Si_3N_4$) as the remainder. The floating member 24 has a smaller density than the molten liquid 20 of the semiconductive material and a larger density than the encapsulating molten liquid 22. Preferred among the above-listed metal oxide members are yttrium oxide ($Y_2O_3$), lanthanum oxide ($La_2O_3$) and cerium oxide ($Ce_2O_3$), and more preferred is yttrium oxide ($Y_2O_3$). A mixture of two or more of the metal oxide members may be used.

Where the content of a metal oxide member or aluminium oxide ($Al_2O_3$) exceeds 10% by weight, then a single crystal semiconductor passing through the opening of the resulting floating member will indicate a prominently distorted cross sectional outline and a noticeable decline in crystallinity. Accordingly, a light-emitting diode whose substrate is formed of such defective single crystal will decrease in emissivity. Conversely, where the content of the metal oxide or aluminium oxide falls below 0.5% by weight, then addition of said ingredient will not display its effect. The resultant floating member will be as defective as the type only prepared from silicon nitride. From the standpoint of ensuring the mechanical strength and corrosion resistance of the floating member and the crystallinity of a single crystal, it is preferred that the content of the metal oxide member be 1 to 8% by weight and that of aluminium oxide be 2 to 5% by weight.

A floating member having the above-mentioned composition can be conveniently prepared by hot press sintering. Where a mixture of powders of the raw materials of the above-defined composition is placed in a prescribed mold and sintered with pressure at a temperature of 1700° to 1800° C., then a desired floating member can be produced in a relatively short period of time. The hot press sintering is generally carried out in an atmosphere of nitrogen.

In operation, the raw material of a single crystal and an overlying encapsulating material are placed in the crucible 14 and heated by the heater 18 to be molten, and the floating member 24 is located in a prescribed position. Then, a seed crystal 30 fitted to a rotary jig 28 is brought into contact with the molten liquid 20 of the semiconductive material through the molten liquid 22 of the encapsulating material in the opening 26 of the floating member 24, and the seed 30 is slowly pulled up by means of the rotary jig 28 by the customary process while rotating said jig 28 in the direction of the indicated arrow, thereby growing a single crystal 32 of III-V compound semiconductive material. The interior of the sealed vessel 12 is kept at a sufficiently high level of pressure to prevent the evaporation of the molten liquids 20, 22 (where a single crystal of, for example, gallium phosphide is grown, a pressure of 40 atm. or over is applied). The cross sectional outline of the single crystal 32 in the process of being grown is defined by the shape of the opening of the floating member 24. The floating member 24 is brought downward, according as the content of the molten liquid 20 of the semiconductive material decreases.

A single crystal grown by the apparatus of this invention has its cross sectional outline rendered little subject to distortion and displays high crystallinity. Accordingly, a light-emitting diode using the single crystal as a substrate indicates high emissivity. The single crystal obtained according to this invention is particularly effective for a light-emitting diode which is produced by forming on a substrate a first semiconductor layer having the same conductivity type as said substrate by the so-called regrowth method of melting a substrate for recrystallization and forming a second semiconductor layer of the opposite conductivity type on the first semiconductor layer. A single crystal of, for example, gallium arsenide grown by the apparatus of this invention is applicable as a substrate not only for a light-emitting diode prepared by the customary liquid phase epitaxial growth method, but also for a field effect transistor.

This invention will be more fully understood by reference to the following examples in which a single crystal of gallium phosphide was grown by the apparatus of the invention, and determination was made of the property of the single crystal and also of the emissivity of a light-emitting diode using the single crystal. In comparison, the properties of the similar single crystal grown by the prior art apparatus and the resultant light-emitting diode were studied.

EXAMPLES

A single crystal was grown by the apparatus arranged as shown in the appended drawing with the composition of a floating member varied as indicated in Table 1 below.

Table 1

| Run No. | Composition of floating member (% by weight) | | | | |
|---|---|---|---|---|---|
| | $Si_3N_4$ | $Y_2O_3$ | $La_2O_3$ | $Ce_2O_3$ | $Al_2O_3$ |
| 1 (ref.) | 100 | 0 | 0 | 0 | 0 |
| 2 (ref.) | 90 | 10 | 0 | 0 | 0 |
| 3 (ref.) | 90 | 0 | 0 | 0 | 10 |
| 4 | 80 | 10 | 0 | 0 | 10 |
| 5 | 89.5 | 10 | 0 | 0 | 0.5 |
| 6 | 94.5 | 0.5 | 0 | 0 | 5.0 |
| 7 | 93 | 2.0 | 0 | 0 | 5.0 |
| 8 | 90 | 5.0 | 0 | 0 | 5.0 |

Table 1-continued

| Run No. | Diameter change (mm) | D pit concentration (cm$^{-2}$) | S pit concentration (cm$^{-2}$) | Minority carrier life time (nsec) | Emission efficiency (%) |
|---|---|---|---|---|---|
| 9 | 93 | 0 | 2.0 | 0 | 5.0 |
| 10 | 93 | 0 | 0 | 2.0 | 5.0 |
| 11 (ref.) | 83 | 12 | 0 | 0 | 5.0 |
| 12 (ref.) | 83 | 5.0 | 0 | 0 | 12 |
| 1 (ref.) | ±2 | ≦3 × 10$^5$ | ≦1 × 10$^5$ | 98 | 0.17 |
| 2 (ref.) | ±2 | ≦3 × 10$^5$ | ≦1 × 10$^5$ | 159 | 0.23 |
| 3 (ref.) | ±2 | ≦3 × 10$^5$ | ≦1 × 10$^5$ | 156 | 0.23 |
| 4 | ±1 | ≦1 × 10$^5$ | ≦1 × 10$^4$ | 245 | 0.40 |
| 5 | ±1 | ≦1 × 10$^5$ | ≦1 × 10$^3$ | 269 | 0.42 |
| 6 | ±1 | ≦1 × 10$^5$ | ≦1 × 10$^3$ | 265 | 0.41 |
| 7 | ±1 | ≦1 × 10$^5$ | ≦5 × 10$^2$ | 310 | 0.48 |
| 8 | ±1 | ≦1 × 10$^5$ | ≦5 × 10$^2$ | 295 | 0.45 |
| 9 | ±1 | ≦1 × 10$^5$ | ≦1 × 10$^3$ | 291 | 0.46 |
| 10 | ±1 | ≦1 × 10$^5$ | ≦1 × 10$^3$ | 289 | 0.46 |
| 11 (ref.) | ±1 | ≦2 × 10$^5$ | ≦1 × 10$^4$ | 237 | 0.35 |
| 12 (ref.) | ±1 | ≦2 × 10$^5$ | ≦1 × 10$^4$ | 227 | 0.32 |

Throughout the examples, a single crystal was prepared from gallium phosphide. This main raw material was mixed with 1 to 10×10$^{17}$ cm$^{-3}$ of sulphur or tellurium as an impurity. Boron trioxide was used as an encapsulating material. Single crystals of gallium phosphide 11 cm long and 4.5 cm in diameter were grown by the customary process. With respect to the crystal, determination was made of diameter change, concentration of dislocation pits (D pits) corresponding to dislocation lines defining the crystallinity of crystal, concentration of saucer pits (S pits) not corresponding to the dislocation lines, and the life time of minority carriers. The results are also set forth in Table 1 above.

Slices were cut out of the respective single crystal samples for use as a substrate. A layer of gallium phosphide was formed on the substrate with the same conductivity type as that of the substrate by the customary regrowth method accompanied with counter dope. Another layer of gallium phosphide having the opposite conductivity type was mounted by liquid phase growth on the first mentioned gallium phosphide layer. The resultant slices were cut into cubic chips measuring 0.5 mm on each side. The chips were embedded in epoxy resin to provide green light-emitting diode devices. The emission efficiency of these green light-emitting diode devices is also indicated in Table 1 above. It is seen from Table 1 that the apparatus of this invention provides a single crystal little subject to distortion and containing D pits and S pits at low concentration (namely, having high crystallinity). Consequently a light-emitting diode whose substrate is formed of said single crystal displays as high emission efficiency as the order of 0.4%.

Relationship between the emission efficiency of a light-emitting diode and the concentration of D pits is already detailed in "Journal of Applied Physics", Vol. 46, p.2629, 1975. However, the present inventors have discovered that said efficiency and the concentration of the S pits are interrelated with each other. Namely, as apparent from Table 1, where a single crystal has different S pit concentrations, though having practically the same D pit concentration, then the minority carriers have different spans of effective life, leading to a difference in the emission efficiency of a light-emitting diode. Thus, the lower the S pit concentration, the more extended the minority carrier life, and in consequence the higher the emission efficiency of a light-emitting diode. The reason is assumed to be that since the different conditions in which a single crystal is grown solely depend on the composition of a floating member used, some impurities contained in said floating member are supposedly related to the S pit concentration. However, such process as analysis of said impurities has failed to confirm the above-mentioned assumption.

The floating members (run Nos. 4 to 10) embodying this invention could be used over 10 times, whereas other types of floating member (run Nos. 1 to 3 and 11, 12) could be used only 2 or 3 times.

What we claim is:

1. An apparatus for making a single crystal of III-V compound semiconductive material which comprises:
    a sealed vessel;
    a crucible received in the sealed vessel to hold a first molten liquid consisting essentially of a III-V compound semiconductive material from which a single crystal is to be grown and a second molten liquid of an encapsulating material overlying said first molten liquid; and
    a floating member which has a smaller density than said first molten liquid and a larger density than said second molten liquid and is set in an interface between said first and second molten liquids, said floating member being made from a mixed material consisting essentially of 0.5 to 10% by weight of at least one metal oxide member selected from the group consisting of oxides of yttrium and the lanthanum series elements, 0.5 to 10% by weight of aluminium oxide and the balance of silicon nitride, and having an opening for defining the cross sectional outline of the single crystal during its growth.

2. An apparatus according to claim 1, wherein the metal oxide member is selected from yttrium oxide, lanthanum oxide and cerium oxide.

3. An apparatus according to claim 1, wherein the metal oxide member is yttrium oxide.

4. An apparatus according to claim 1, 2 or 3, wherein the content of the metal oxide member is 1 to 8% by weight, and the content of aluminium oxide is 2 to 5% by weight.

5. An apparatus according to claim 1, 2, or 3, which further comprises a heating means positioned around the crucible to heat the first and second molten liquids.

6. An apparatus according to claim 5, which further comprises means for bringing a seed crystal into contact with the first molten liquid through the second molten liquid in the opening of the floating member and growing the single crystal while being slowly pulled up from the second molten liquid through the opening of the floating member.

* * * * *